(12) United States Patent
Mathew et al.

(10) Patent No.: US 7,807,572 B2
(45) Date of Patent: Oct. 5, 2010

(54) MICROPAD FORMATION FOR A SEMICONDUCTOR

(75) Inventors: Varughese Mathew, Austin, TX (US); Eddie Acosta, Austin, TX (US); Ritwik Chatterjee, Austin, TX (US); Sam S. Garcia, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 136 days.

(21) Appl. No.: 11/969,368

(22) Filed: Jan. 4, 2008

(65) Prior Publication Data

US 2009/0176366 A1 Jul. 9, 2009

(51) Int. Cl.
*H01L 21/44* (2006.01)
(52) U.S. Cl. ............... 438/678; 438/637; 438/612; 438/631; 438/625; 438/687; 257/E21.175
(58) Field of Classification Search .......... 438/637, 438/612, 631, 625, 678, 687; 257/E21.175
See application file for complete search history.

(56) References Cited

U.S. PATENT DOCUMENTS

| | | | |
|---|---|---|---|
| 3,395,040 A * | 7/1968 | Pritchard, Jr. et al. ......... 427/63 |
| 4,692,349 A | 9/1987 | Georgiou et al. |
| 4,832,799 A | 5/1989 | Knudsen et al. |
| 5,162,144 A | 11/1992 | Brown et al. |
| 5,196,053 A * | 3/1993 | Dodd et al. ................... 205/85 |
| 5,309,632 A | 5/1994 | Takahashi et al. |
| 5,706,578 A | 1/1998 | Hubner |
| 6,245,658 B1 | 6/2001 | Buynoski |
| 6,680,128 B2 | 1/2004 | Mei |
| 6,720,499 B2 | 4/2004 | Bokisa et al. |
| 6,784,088 B2 | 8/2004 | Edelstein et al. |

(Continued)

FOREIGN PATENT DOCUMENTS

JP 2003282615 10/2003

OTHER PUBLICATIONS

Mathew, V. et al.; "Selective Formation of Micropads for 3D Interconnect Applications"; 212TH ECS Meeting. Washington DC; Oct. 7-12, 2007; 10 pp; The Elctrochemical Society.

(Continued)

*Primary Examiner*—Charles D Garber
*Assistant Examiner*—Hajar Kolahdouzan
(74) *Attorney, Agent, or Firm*—Robert L. King; James L. Clingan, Jr.

(57) ABSTRACT

A method forms a micropad to an external contact of a first semiconductor device. A stud of copper is formed over the external contact. The stud extends above a surface of the first semiconductor device. The stud of copper is immersed in a solution of tin. The tin replaces at least 95 percent of the copper of the stud and preferably more than 99 percent. The result is a tin micropad that has less than 5 percent copper by weight. Since the micropad is substantially pure tin, intermetallic bonds will not form during the time while the micropads of the first semiconductor device are not bonded. Smaller micropad dimensions result since intermetallic bonds do not form. When the first semiconductor device is bonded to an overlying second semiconductor device, the bond dimensions do not significantly increase the height of stacked chips.

20 Claims, 11 Drawing Sheets

U.S. PATENT DOCUMENTS

| | | | |
|---|---|---|---|
| 6,811,658 | B2 | 11/2004 | Hongo et al. |
| 6,924,232 | B2 | 8/2005 | Mathew et al. |
| 7,049,234 | B2 | 5/2006 | Cheng et al. |
| 7,078,272 | B2 | 7/2006 | Ho et al. |
| 7,170,170 | B2 | 1/2007 | Yeo |
| 7,317,253 | B2 | 1/2008 | Nogami |
| 7,320,935 | B2 | 1/2008 | Leu et al. |
| 7,332,764 | B2 | 2/2008 | Choi et al. |
| 7,572,723 | B2 | 8/2009 | Mathew et al. |
| 2002/0043466 | A1* | 4/2002 | Dordi et al. .......... 205/123 |
| 2002/0155661 | A1* | 10/2002 | Massingill et al. ....... 438/244 |
| 2003/0140988 | A1 | 7/2003 | Gandikota et al. |
| 2004/0224491 | A1* | 11/2004 | Datta ............... 438/613 |
| 2004/0245630 | A1 | 12/2004 | Huang et al. |
| 2006/0202345 | A1* | 9/2006 | Barth et al. .......... 257/761 |
| 2007/0085162 | A1* | 4/2007 | O'Brien et al. ........ 257/499 |
| 2007/0197396 | A1* | 8/2007 | Holcomb ............ 505/400 |
| 2007/0298605 | A1 | 12/2007 | Andryushchenko et al. |

OTHER PUBLICATIONS

Kostner, Hannes et al.; "New Flip-Chip on Chip Process Supercedes Embedded Technologies"; 14th European Microelectronics and Packaging Conference & Exhibition, Friedrichshafen, Germany; Jun. 23-25, 2003; pp. 1-5.

Huebner, H. et al.; "Face-To-Face Chip Integration With Full Metal Interface"; Conference Proceedings ULSI XVII, Materials Research Society; 2003; pp. 53-38, The British Library.

PCT Search Report and Written Opinion, PCT/US2008/086920, mailed Jun. 29, 2009.

Office Action in related U.S. Appl. No. 11/552,821, mailed Oct. 2, 2008.

Notice of Allowance in related U.S. Appl. No. 11/552,821, mailed Apr. 20, 2009.

Office Action on related U.S. Appl. No. 11/552,821 mailed Oct. 2, 2008.

Notice of Allowance on related U.S. Appl. No. 11/552,821 Mailed Apr. 20, 2009.

* cited by examiner

MICROPAD FORMATION FOR A SEMICONDUCTOR

RELATED APPLICATION

This application is related to our U.S. application Ser. No. 11/552,821, now U.S. Pat. No. 7,572,723, entitled "A Micropad For Bonding And A Method Therefor" filed on Oct. 25, 2006, and assigned to the assignee hereof.

BACKGROUND

1. Field

This invention relates generally to semiconductors, and more specifically, to external electrical connections to semiconductors.

2. Related Art

Integrated circuits are increasingly connected to each other by stacking two or more integrated circuits in a three dimensional (3D) stack. For example, this technique has been used to double an amount of memory by stacking two memory integrated circuits. An alternative form is to stack an integrated circuit with a semiconductor wafer. The stacked integrated circuits make electrical contact to each other through chip bonding. The chip bonding utilizes a bond pad on one integrate circuit that is bonded with another bond pad of the other integrated circuit. The bond pads are often referred to as "micropads". Thermocompression bonding of micropads from two different die or wafers provide both mechanical and electrical inter-strata connections of the stacked die. A known bonding process uses a copper micropad at a bond pad of a first integrated circuit and copper and tin at a bond pad of a second integrated circuit. The two bond pads are aligned and boded together with the copper of the bond pad of the first integrated circuit bonding to the tin of the bond pad of the second integrated circuit. However, interdiffusion of the copper and tin of the bond pad of the second integrated circuit occurs at low temperature including room temperature to form intermetallic compounds such as $Cu_3Sn$ and $Cu_6Sn_5$. Thick intermetallic compounds are brittle and contribute to reliability issues associated with the bond pad. For example, a rigid pad made of an intermetallic compound is prone to shear and stress fractures. When a significant amount of intermetallic compound is formed, additional tin must be added to insure the material remains bondable. The additional tin increases the thickness which is undesired. Also, such intermetallic compounds are stable up to very high temperatures, such as six hundred degrees Celsius, and thus become non-bondable. Such high temperatures are too large to be useful for a bonding material because other portions of a completed integrated circuit are degraded or fail when subjected to such high temperatures.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

FIGS 10-13 illustrate n cross-sectional form another form of a micropad structure of a first semiconductor formed for connection to a second semiconductor; and.

Skilled artisans appreciate that elements in the figures are illustrated for simplicity and clarity and have not necessarily been drawn to scale. For example, the dimensions of some of the elements in the figures may be exaggerated relative to other elements to help to improve understanding of embodiments of the present invention.

DETAILED DESCRIPTION

Figure 1:
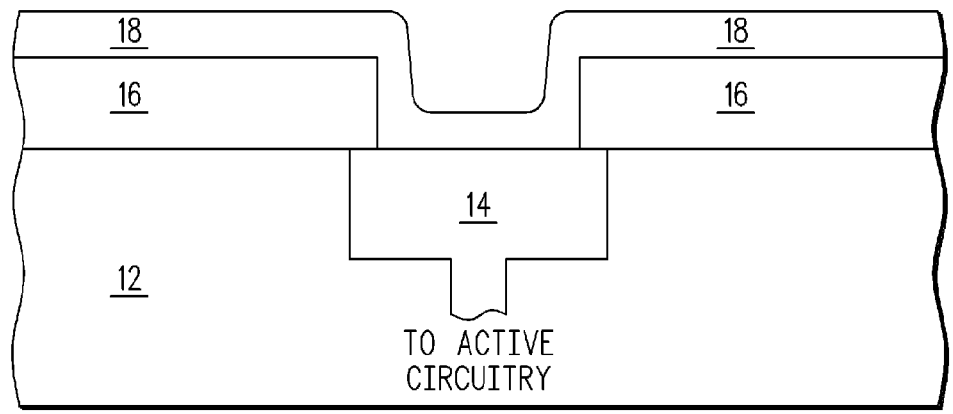
FIGS. 1-9 illustrate in cross-sectional form one form of a micropad structure of a first semiconductor formed for connection to a second semiconductor.

Illustrated in FIG. 1 a cross-sectional view of a portion of a semiconductor wafer 10 that is processed in accordance with one form the present invention. A semiconductor device 12 is illustrated wherein the semiconductor device 12 is a portion of a die on the semiconductor wafer 10. Within the semiconductor device 12 is a substrate having transistors and numerous electrical contacts. For convenience of illustration a single electrical contact is illustrated in the form of a contact 14 within the substrate of semiconductor device 12. The contact 14 is an external contact of the semiconductor device 12 and provides electrical contact from an initially exposed surface of the semiconductor device 12 to active circuitry (not shown) that is fabricated at lower levels of the semiconductor device 12. Patterned above the semiconductor device 12 in a manner that leaves a significant portion of the contact 14 exposed is a passivation layer 16. Passivation layer 16 is an electrically insulating material. In one form the passivation layer 16 is a layer of insulating material. In other forms the passivation layer 16 may be implemented with multiple layers of insulating material. It should be appreciated that passivation materials such as silicon oxynitride, silicon nitrides, TEOS films, plasma enhanced nitrides and combinations thereof may be used. Overlying the passivation layer 16 is a barrier layer 18 which is conformal. The barrier layer 18 functions to promote adhesion and function as a barrier to copper and tin. Various barrier materials may be used including titanium tungsten (TiW), titanium nitride (TiN) or tungsten (W). Other barrier materials may be implemented. The barrier layer 18 is formed directly on the contact 14.

Figure 2:
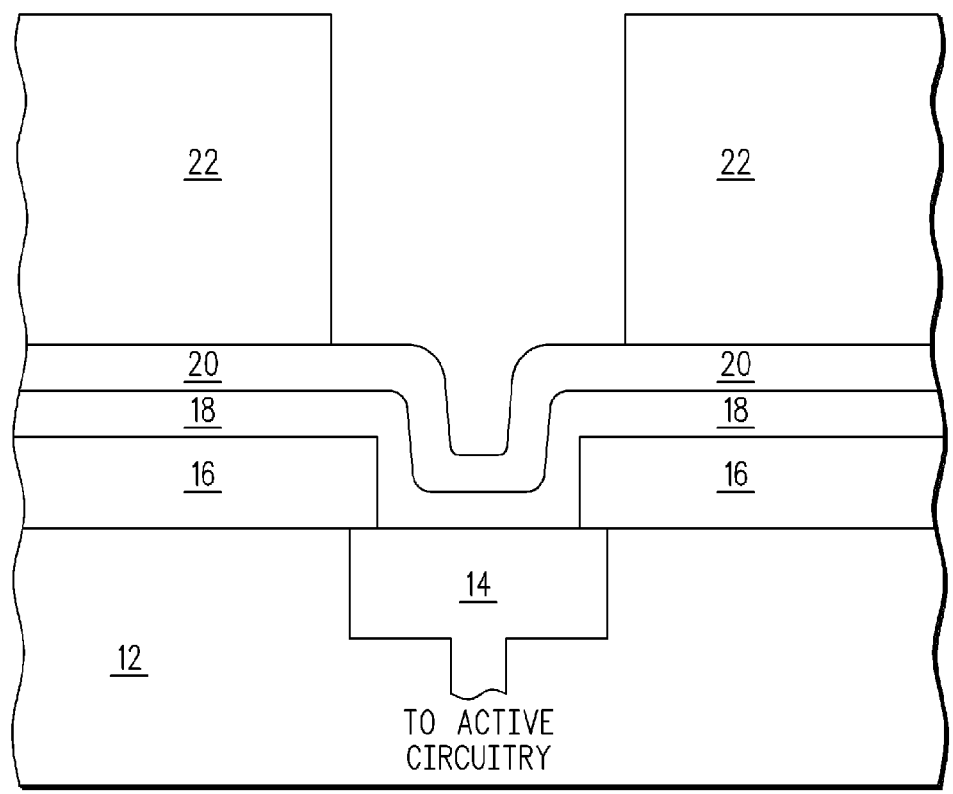

Illustrated in FIG. 2 is further processing of the semiconductor wafer 10. A seed layer 20 if formed overlying the barrier layer 18 and is conformal. In one form the seed layer 20 is copper. Other metals may be used. Copper is used in this embodiment in contemplation of assisting as a seed in the development of overlying copper above the contact 14. After the formation of the seed layer 20 a patterned layer of photoresist 22 is formed wherein the area above the contact 14 is open in the pattern for exposure to subsequent processing. Conventional photoresist material is used as the layer of photoresist 22.

Figure 3:
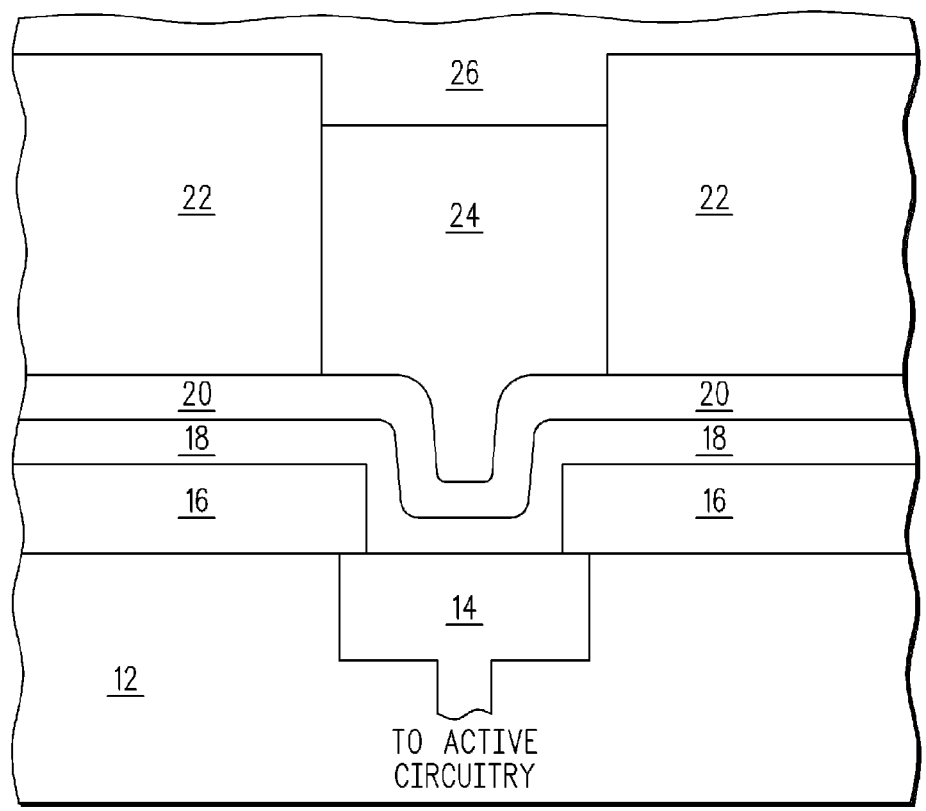

Illustrated in FIG. 3 is further processing of the semiconductor wafer 10 wherein the semiconductor wafer 10 is exposed to a copper electroplating bath 26. The electroplating solution that is used contains copper. With the assistance of the copper seed layer 20, a copper stud 24 is formed overlying the contact 14 and the barrier layer 18. The barrier layer 18 prevents the migration of copper from the seed layer 20 to contact 14. The semiconductor wafer 10 is exposed to the copper electroplating bath 26 for a sufficient amount of time and sufficient charge is passed during this processing to form the copper stud 24 to a desired height overlying the contact 14.

Figure 4:
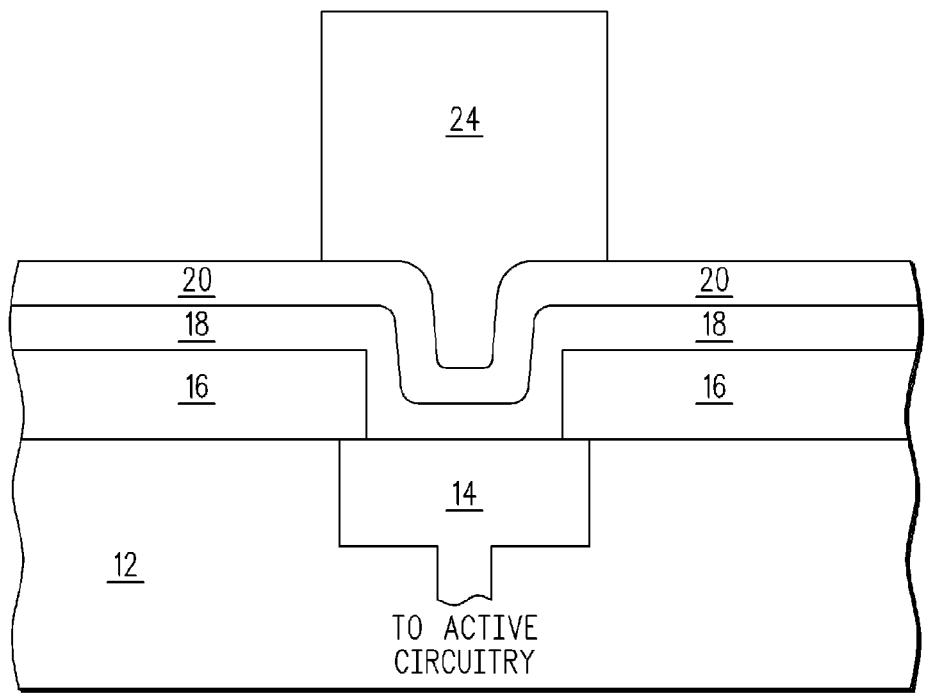

Illustrated in FIG. 4 is further processing of the semiconductor wafer 10 wherein the semiconductor wafer 10 is removed from the copper electroplating bath 26. The patterned layer of photoresist 22 is also removed by performing a conventional wet etch. Therefore, at this point in the processing a copper stud 24 has been formed overlying the contact 14 and extending above an upper surface of the seed layer by an amount that is dependent on the processing conditions such as the amount of time that the semiconductor wafer 10 was in the copper electroplating bath 26 and the amount of charge passed during the copper electroplating step.

Figure 5:
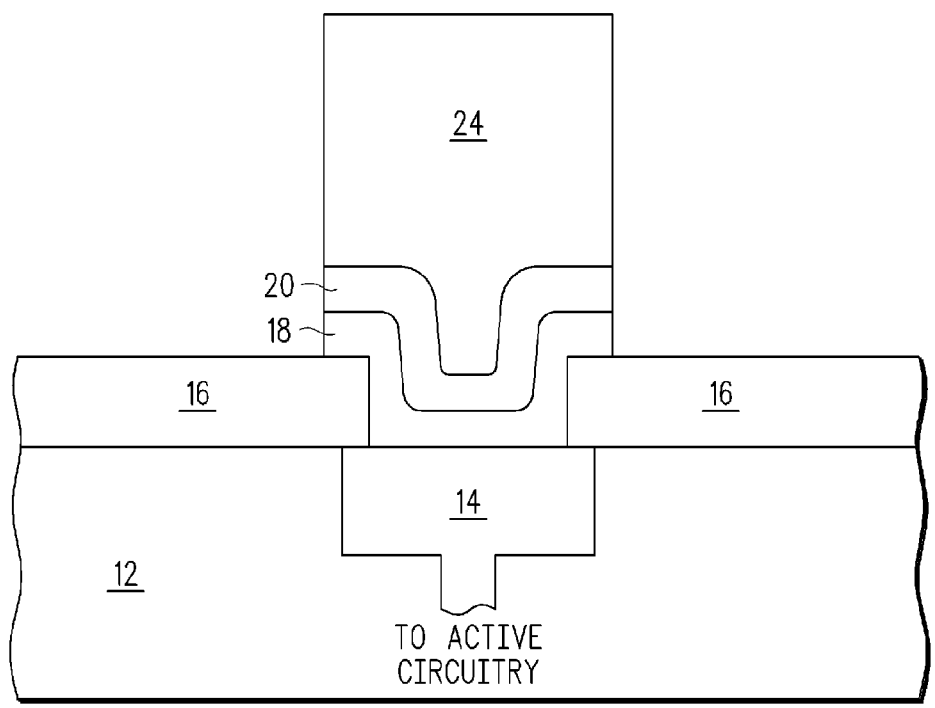

Illustrated in FIG. 5 is further processing of the semiconductor wafer 10 wherein exposed portions of the seed layer 20 and the barrier layer 18 are removed by a conventional wet etch. Only those portions of the seed layer 20 and the barrier layer 18 that underlie the copper stud 24 remain after the wet etch.

Figure 6:
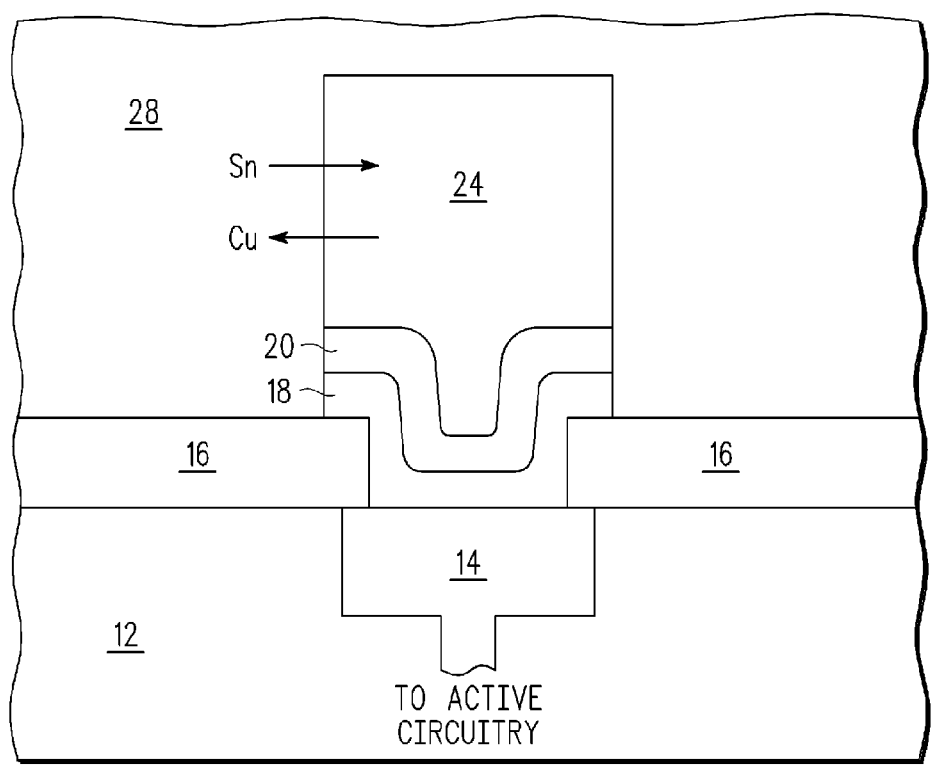

Illustrated in FIG. 6 is further processing of the semiconductor wafer 10 wherein the semiconductor wafer 10 is placed in a tin immersion plating bath 28 for a predetermined amount of time. The tin immersion plating bath 28 functions to remove the copper from both the copper stud 24 and the seed layer 20 and replace the copper with pure tin (Sn). The tin replaces at least ninety-five percent (95%) of the copper in copper stud 24 to result in a tin micropad that has less than five percent (5%) copper by weight. The copper is removed from the copper stud 24 as copper ions are put into solution in the plating bath 28. The reaction is a chemical replacement reaction which can be generally represented as:

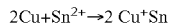

$$2Cu+Sn^{2+} \rightarrow 2\ Cu^{+}Sn$$

The amount of time required for the transfer of material depends upon various factors including time and temperature. In one form the tin immersion plating bath 28 is a solution that contains tin salt and other components such as complexing agents and surfactants and is maintained at a temperature that is within a range of temperatures equal to or greater than sixty degrees Celsius and up to eighty-five degrees Celsius.

Figure 7:
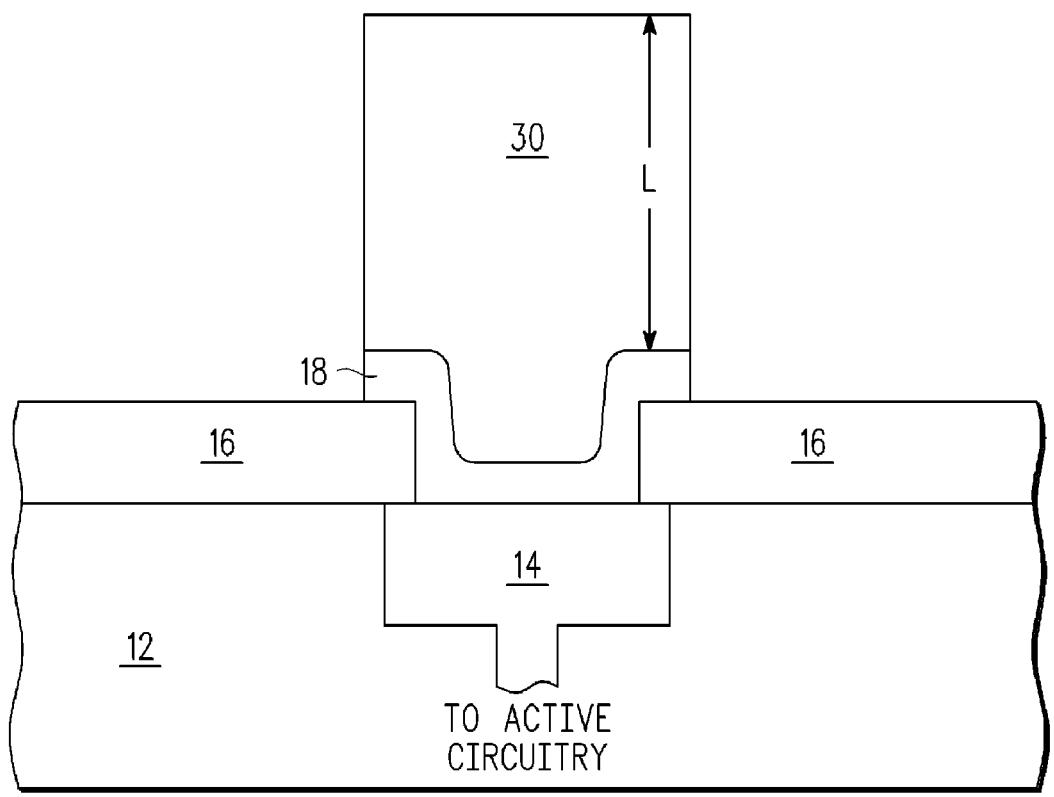

Illustrated in FIG. 7 is further processing of the semiconductor wafer 10 wherein the semiconductor wafer 10 is removed from the tin immersion plating bath 28. A resulting pure tin micropad 30 exists wherein the pure tin micropad 30 has a height of "L" that is within a range of one microns (0.001 mm) to five microns (0.005 mm). The height "L" is determined in large part by the height of the copper thickness of stud 24 when it was formed in FIG. 3.

Figure 8:
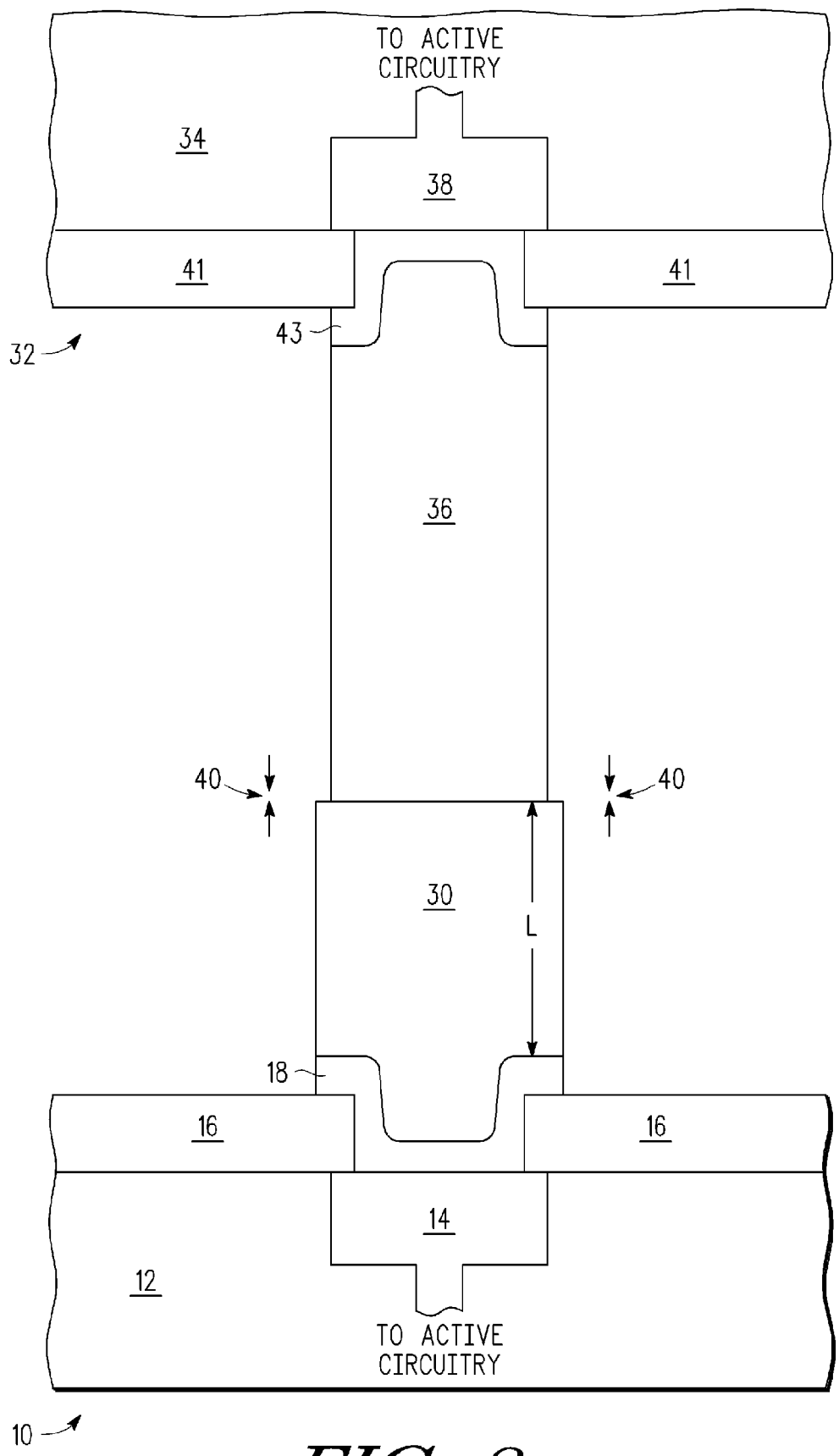

Illustrated in FIG. 8 is further processing of the semiconductor wafer 10 wherein a second semiconductor wafer 32 is connected to form a three dimensional (3D) structure. The second semiconductor wafer 32 has a semiconductor device 34 having a contact 38 that is connected to active circuitry (not shown) within the semiconductor device 34. Connected directly to the contact 38 is a barrier layer 43 that is analogous to barrier layer 18 of semiconductor device 12. Connected to the barrier layer 43 is a copper micropad 36. In an implementation where the pure tin micropad 30 has a height within a range of substantially one micron to three microns, the height of the copper micropad 36 is within a range of three to ten microns, depending upon the value of the micropad 30. Within that range, copper micropad 36 is at least twice the height of micropad 30 and may be three or more time taller. The base of the copper micropad 36 that is adjacent the contact 38 is surrounded by an insulating layer 41. In one form the insulating layer 41 is a layer of passivation material such as a nitride or TEOS. A compression force 40 is used to physically bond semiconductor device 12 to semiconductor device 34. When compression force 40 is applied at a sufficiently high temperature to soften the tin micropad 30 and a bond is formed that electrically connects contact 14 to contact 38. In one form the copper micropad 36 is pressed against the pure tin micropad 30 in a ambient temperature in excess of the melting point of tin which is 232 degrees Celsius.

Figure 9:
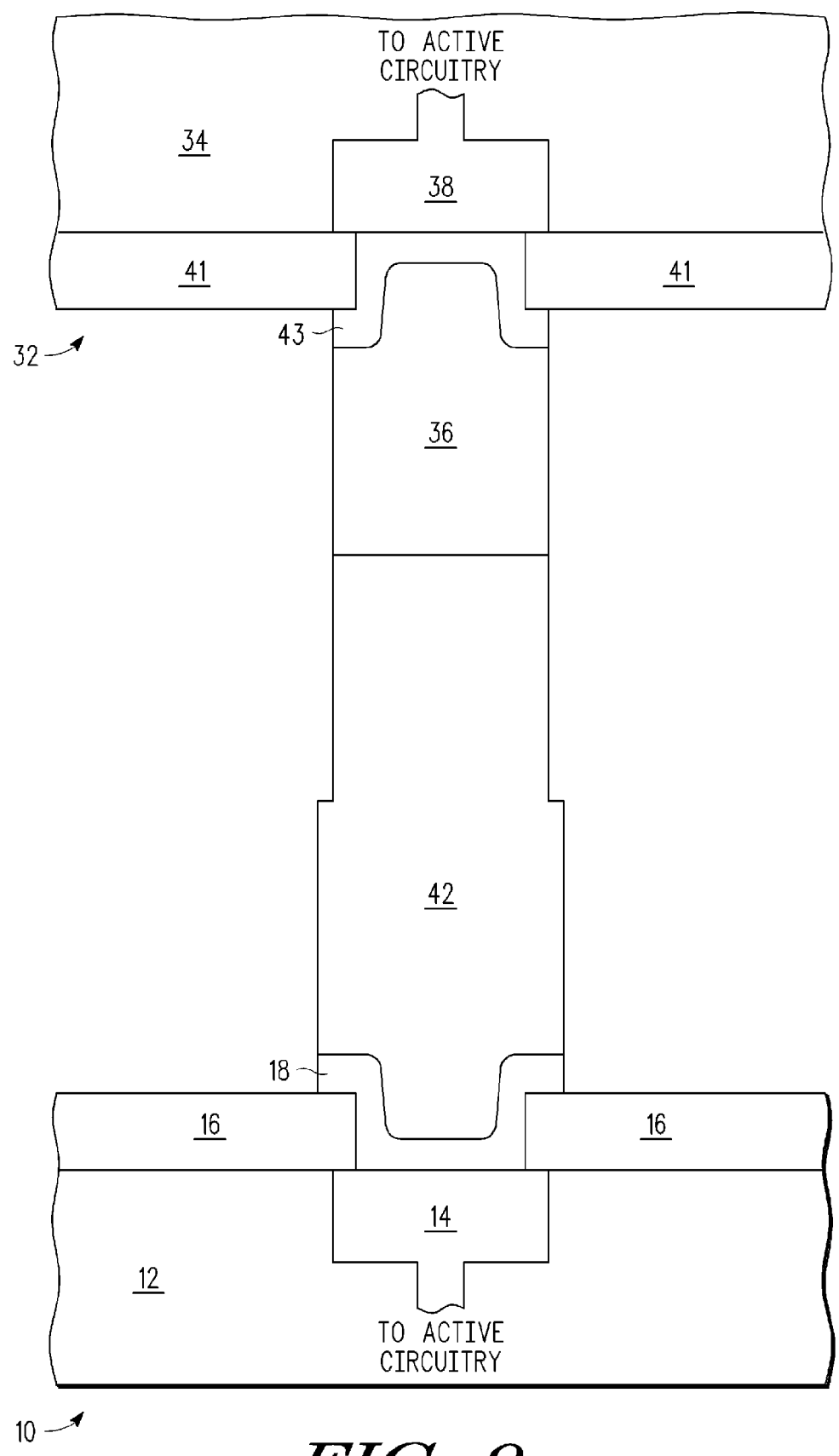

Illustrated in FIG. 9 is further processing of the semiconductor wafer 10 and the semiconductor wafer 32. A copper/tin intermetallic microbond 42 is formed wherein the tin of micropad 30 is consumed by the copper of micropad 36 to form a solid bond between semiconductor device 12 and semiconductor device 34. A portion of the copper micropad 36 remains copper and does not interact with the tin of the micropad 30. Therefore there has been provided an improved semiconductor bond pad between two semiconductor devices.

Figure 10:
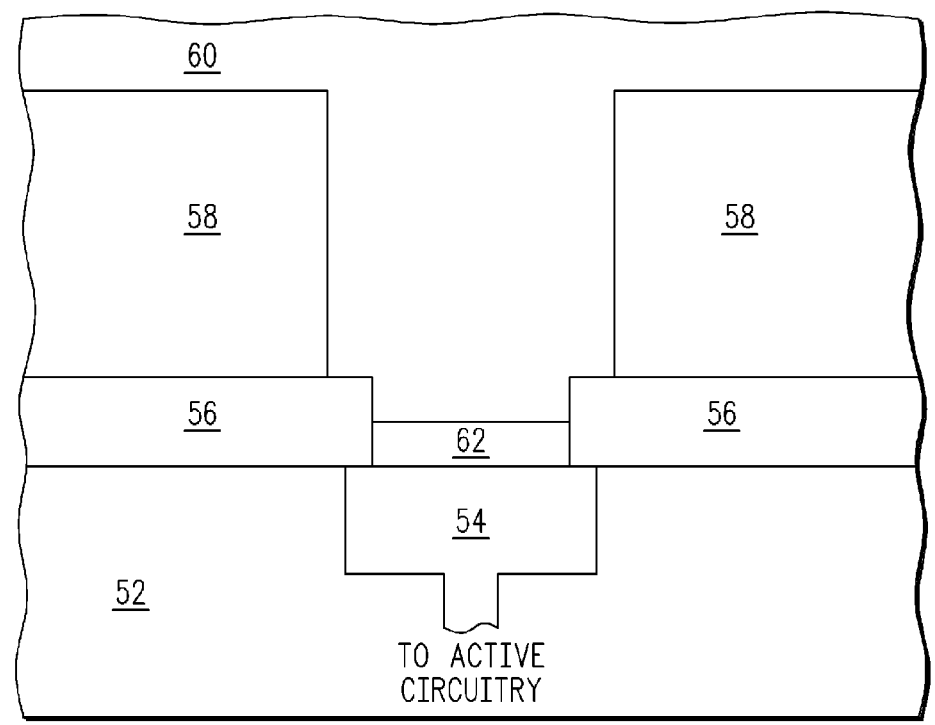

Illustrated in FIG. 10 is another embodiment of forming a micropad for a semiconductor device 52 of a wafer 50 wherein the micropad is readily bonded with another micropad of another semiconductor device. In the illustrated form the semiconductor device 52 had an external contact 54 that is connected to active circuitry (not shown) within a substrate of the semiconductor device 52. Overlying the semiconductor device 52 is a patterned passivation layer 56. The patterned passivation layer 56 may be implemented with multiple layers in another form. In one form the patterned passivation layer 56 is an insulating material such as Silicon Oxy Nitride, silicon nitrides, TEOS films, plasma enhanced nitrides or combinations thereof. Overlying the patterned passivation layer 56 is a layer of patterned photoresist 58. The layer of patterned photoresist 58 has an opening that exposes the contact 54. Within the opening and above contact 54 is formed a selectively deposited barrier layer 62. The barrier layer 62 is in direct contact with the contact 54. Various selectively deposited barrier materials may be used such as cobalt tungsten boron (CoWB), cobalt tungsten phosphorous (CoWP), cobalt tungsten phosphorous boron (CoWPB), cobalt molybdenum boron (CoMoB), cobalt molybdenum phosphorous (CoMoP), nickel tungsten phosphorous (NiWP) or combinations thereof. The barrier layer 62 functions to block copper and tin from contacting the contact 54. In this form the semiconductor device 52 is placed within an electroless plating bath 60. The electroless plating bath 60 is a solution of a commercially available electroless plating solution.

Figure 11:
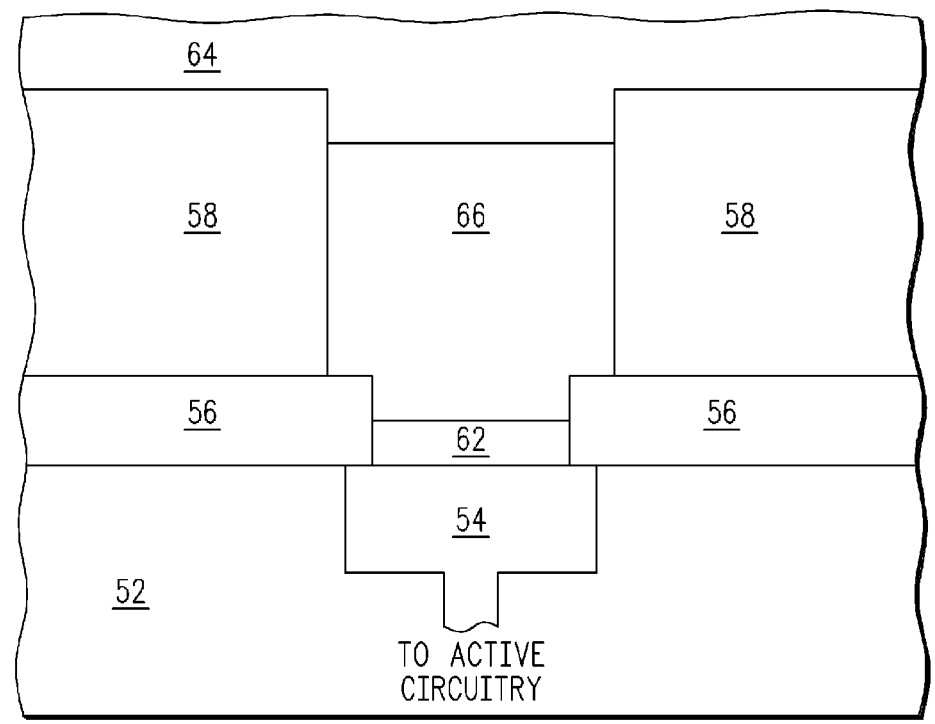

Illustrated in FIG. 11 is the formation of a copper stud 66 as a result of the semiconductor device 52 remaining in the electroless copper plating bath 64 or a significant amount of time to deposit copper on the barrier layer 62. The amount of time required to deposit copper stud 66 depends on many variable including temperature and the copper solution used in the electroless copper plating bath 64. The amount of time also is determined by a desired height of the copper stud 66. In one form the copper stud 66 is formed to a height that subsequently determines the height of the final micropad structure. This height can therefore vary.

Figure 12:
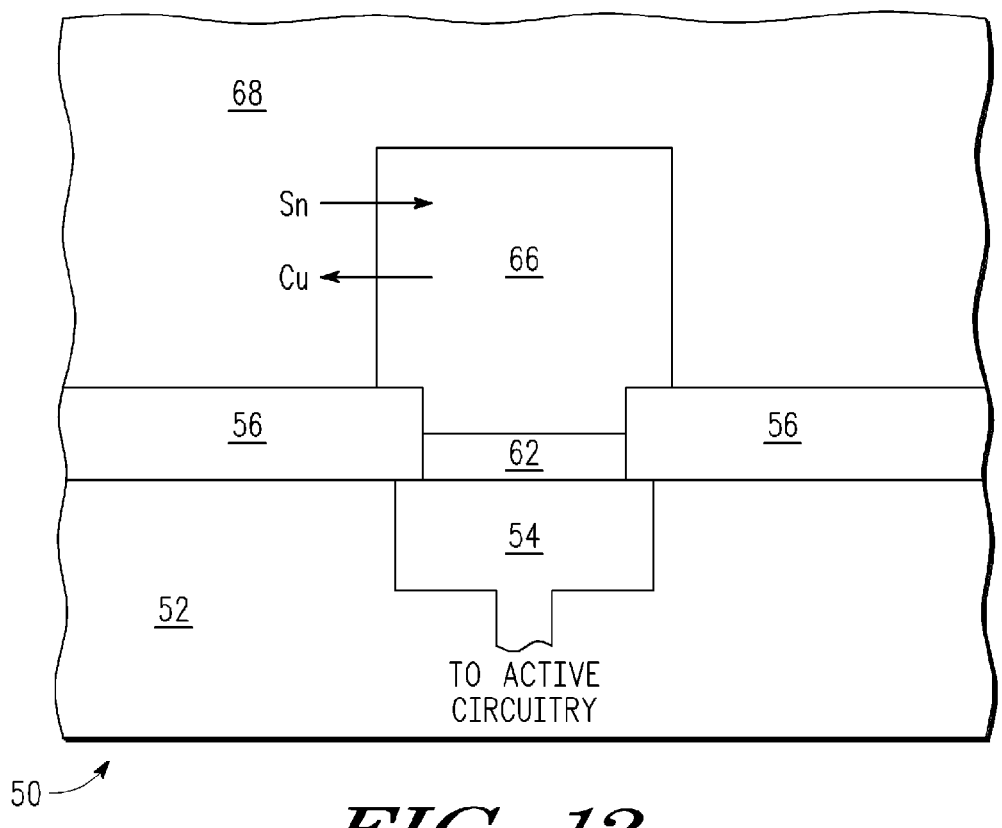

Illustrated in FIG. 12 is further processing of semiconductor device 52 wherein the semiconductor device is removed from the electroless copper plating bath 64. The patterned photoresist 58 is subsequently removed by either a wet etch or a dry etch. With the patterned photoresist 58 is removed, the copper stud 66 extends from the barrier layer 62 above the contact 54. The semiconductor device 52 is then placed in a tin immersion bath 68. The tin immersion bath 68 functions to remove copper from the copper stud 66 and replace the copper with substantially pure tin with a purity of at least ninety-five percent. Preferably the purity is approximately ninety-nine percent or greater. In one form the tin immersion bath 68 is formed by using any of commercially available products such as, for example, TIMPOSIT™ LT-34 from Rohm and Haas Electronic Materials of Stannostar GEM PLUS™ from Enthone. The tin immersion is performed at a temperature that may be within a variable range such as sixty to eighty-five degrees Celsius. It should be apparent that other temperatures may be used.

Figure 13:
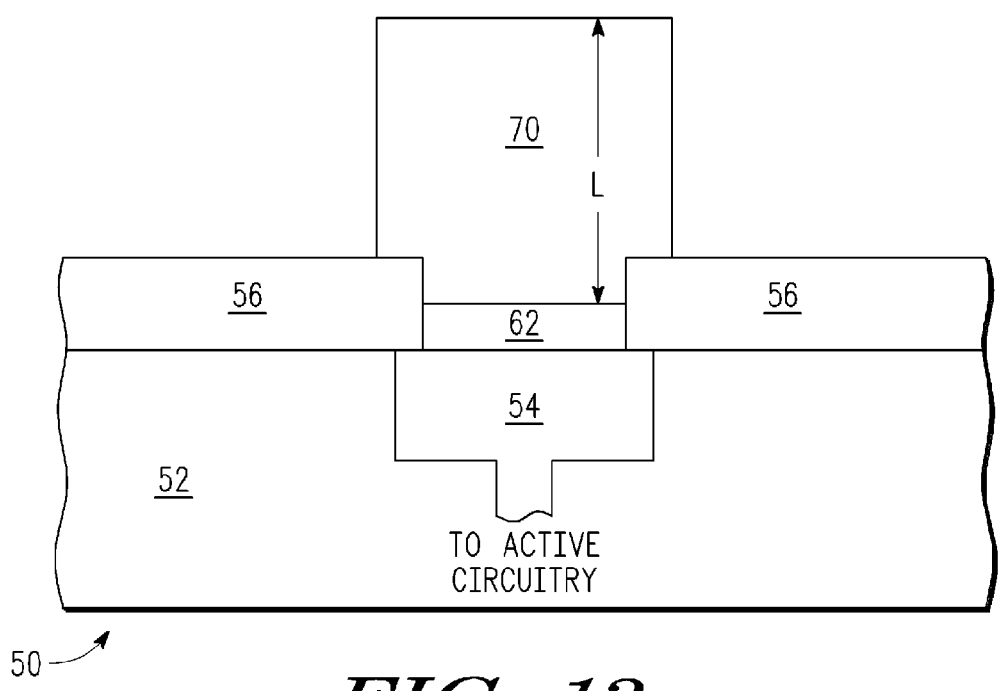

Illustrated in FIG. 13 is a completed micropad wherein a tin micropad 70 having a height of "L" has been formed. The height is typically within a range of one to three microns, but other dimensions may be formed. At this point in the processing the semiconductor device 52 may be stored without the tin micropad 70 changing into an intermetallic bond pad. When the semiconductor device 52 is subsequently bonded at tin micropad 70 to another micropad of another integrated circuit, the tin react at a relatively low boding temperature with a copper micropad to become a solid and reliable intermetallic bond.

Figure 14:
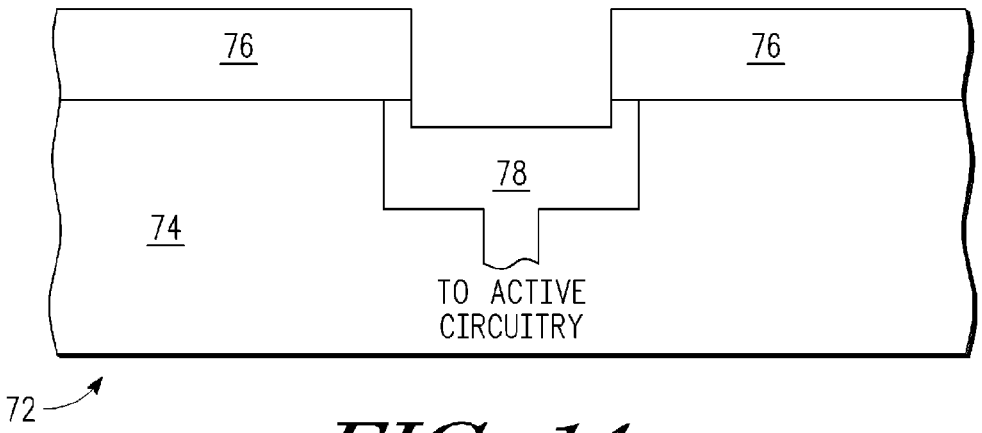
FIGS 14-20 illustrate in cross-sectional form yet another form of a micropad structure of a first semiconductor formed for connection to a second semiconductor.

Illustrated in FIG. 14 is a cross-section of another form of a micropad for bonding a semiconductor device. A portion of a wafer 72 is illustrated having a semiconductor device 74 formed within a substrate. The semiconductor device 74 has an exposed recessed external contact 78 that connects to active circuitry (not shown) that has been formed at other portions of the semiconductor device 74. Overlying the semiconductor device 74 is an insulating layer 76 of passivation material that is patterned to expose the contact 78. The exposed portion of the contact 78 is recessed by using a wet etch process. The passivation material of insulating layer 76 may be any of various conventional passivation materials.

Figure 15:
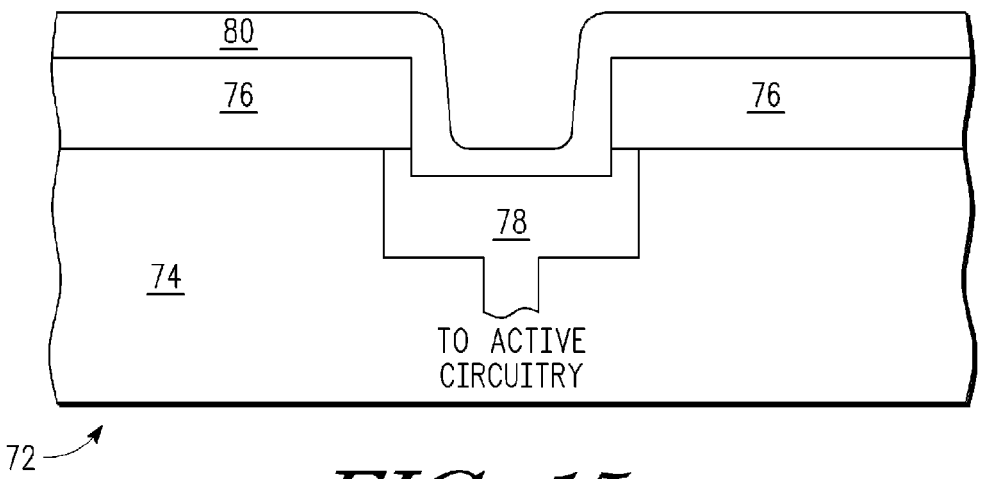

Illustrated in FIG. 15 is a cross-section of further processing of semiconductor device 74. Overlying the semiconductor device 74 is formed a conformal barrier layer 80. The barrier layer 80 is tantalum (Ta) for blocking tin and copper from entering the contact 78. Tantalum functions very well for these purposes. Barrier layer 80 may also be implemented by using titanium (Ti), titanium nitride (TiN) and tantalum nitride (TaN) or combinations thereof. All of these materials successfully block tin from entering contact 78 and contaminating the contact 78.

Figure 16:
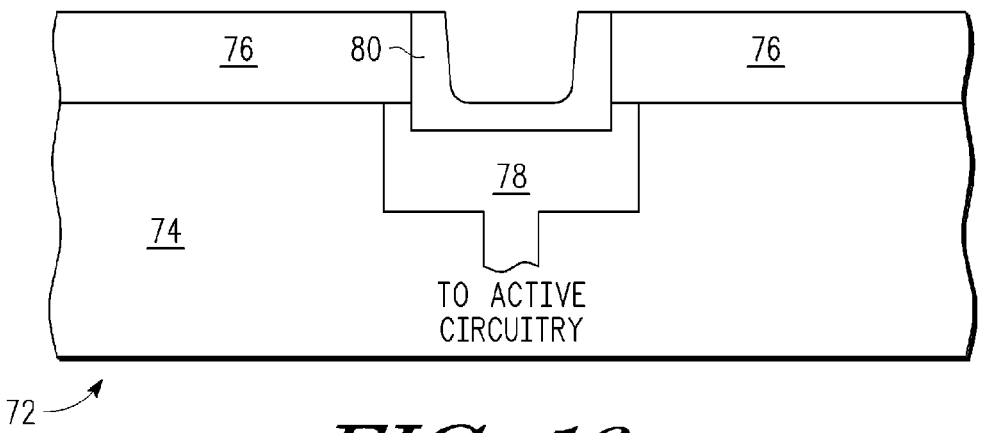

Illustrating in FIG. 16 is a cross-section of further processing of semiconductor device 74. A chemical mechanical polishing (CMP) step is implemented wherein the barrier layer 80 is removed from those areas overlying the insulating layer 76. A planar top surface results from the CMP processing. At this point in the processing of semiconductor device 74, the barrier layer 80 is only in the contact area overlying contact 78.

Figure 17:
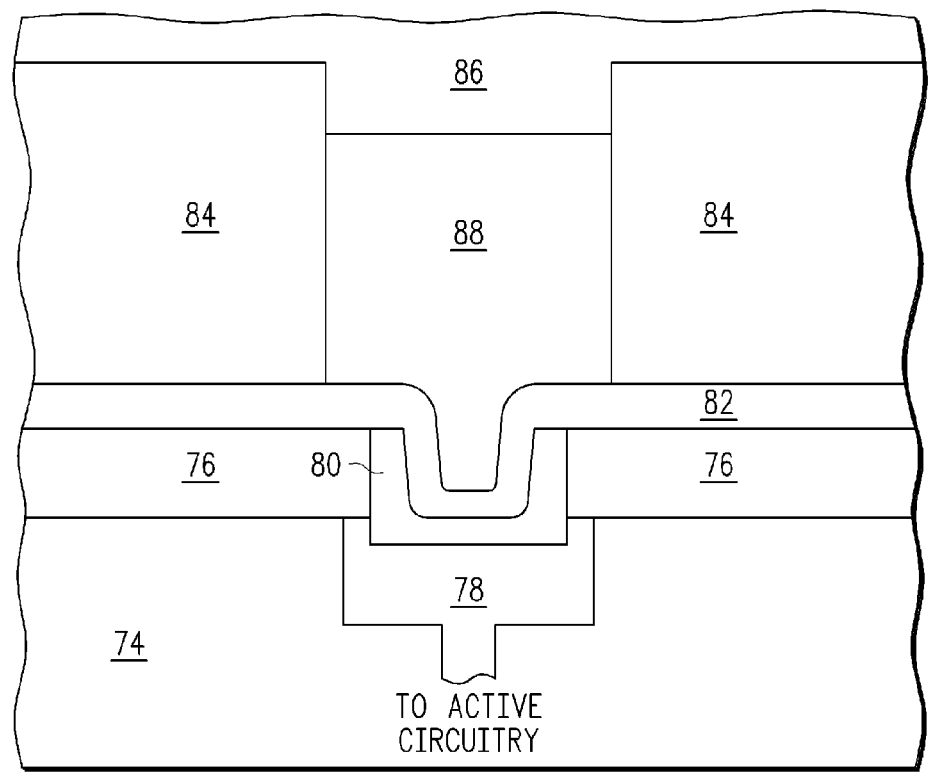

Illustrated in FIG. 17 is a cross-section of further processing of semiconductor device 74. A conformal seed layer 82 is formed overlying the semiconductor device 74. In one form the seed layer is copper because it is desired to form copper overlying the seed layer 82. It should be apparent that other metals may be used for seed layer 82 if other metal types are desired to be formed overlying the seed layer 82. A layer of patterned photoresist 84 is formed overlying the seed layer 82 wherein an opening is formed around the contact region and overlying contact 78. The semiconductor device 74 is then placed in an electroplating bath 86. A conventional commercially available solution may be used for the electroplating bath 86. When semiconductor device 74 is place in the electroplating bath 86, the exposed seed layer 82 stimulates the formation of copper stud 88 in the opening of the patterned layer of photoresist 84. The copper stud 88 is formed to a predetermined height.

Figure 18:
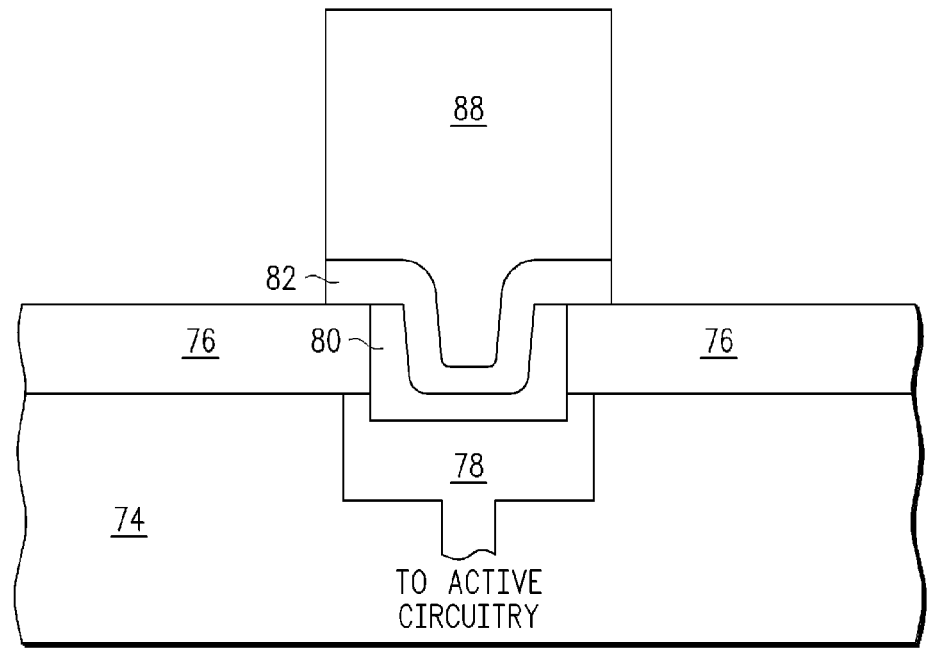

Illustrated in FIG. 18 is a cross-section of further processing of semiconductor device 74. The semiconductor device 74 is removed from the electroplating bath 86. The layer of patterned photoresist 84 is removed by either a wet etch or a dry etch. The seed layer 82 is also removed by a subsequent wet etch to provide the resulting structure of FIG. 18 wherein the copper stud 88 is exposed and overlies the contact region to make electrical contact with the contact 78 via the barrier layer 80 and the seed layer 82.

Figure 19:
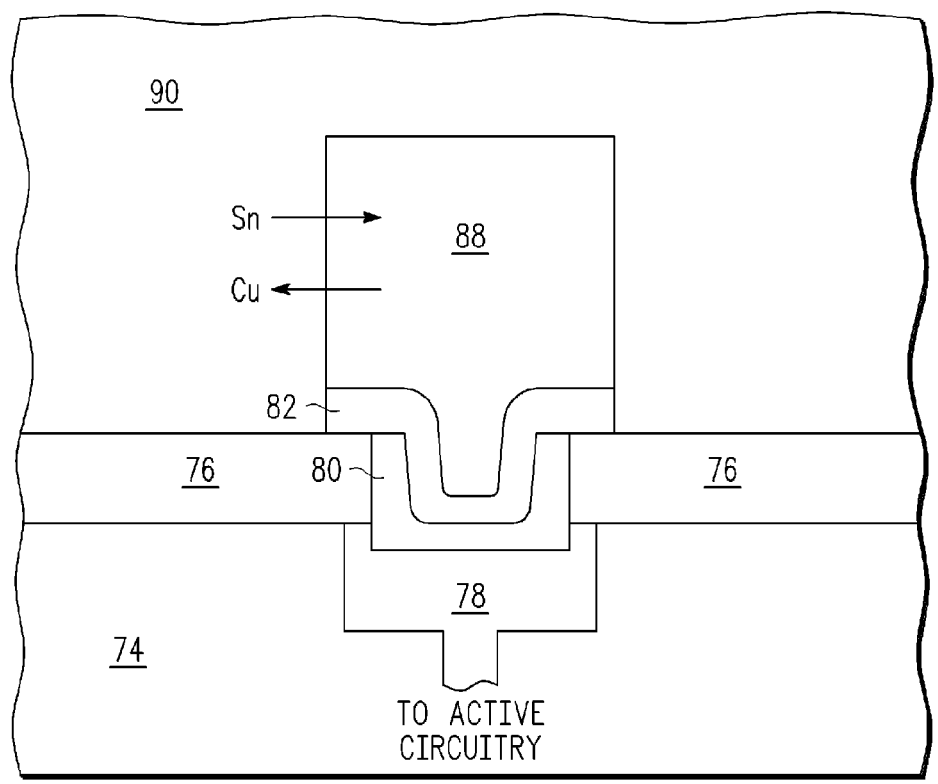

Illustrated in FIG. 19 is a cross-section of further processing of semiconductor device 74. The semiconductor device 74 is immersed in a tin immersion bath 90. The tin immersion bath 90 functions to remove copper from the copper stud 88 and replace the copper with substantially pure tin with a purity of at least ninety-five percent. Preferably the purity is approximately ninety-nine percent of greater. In one form the tin immersion bath 90 is formed by using any of commercially available products such as, for example, TINPOSIT™ LT-34 from Rohm and Haas Electronic Materials of Stannostar GEM PLUS™ from Enthone. The tin immersion is performed at a temperature that may be within a variable range such as sixty to eighty-five degrees Celsius. It should be apparent that other temperatures may be used.

Figure 20:
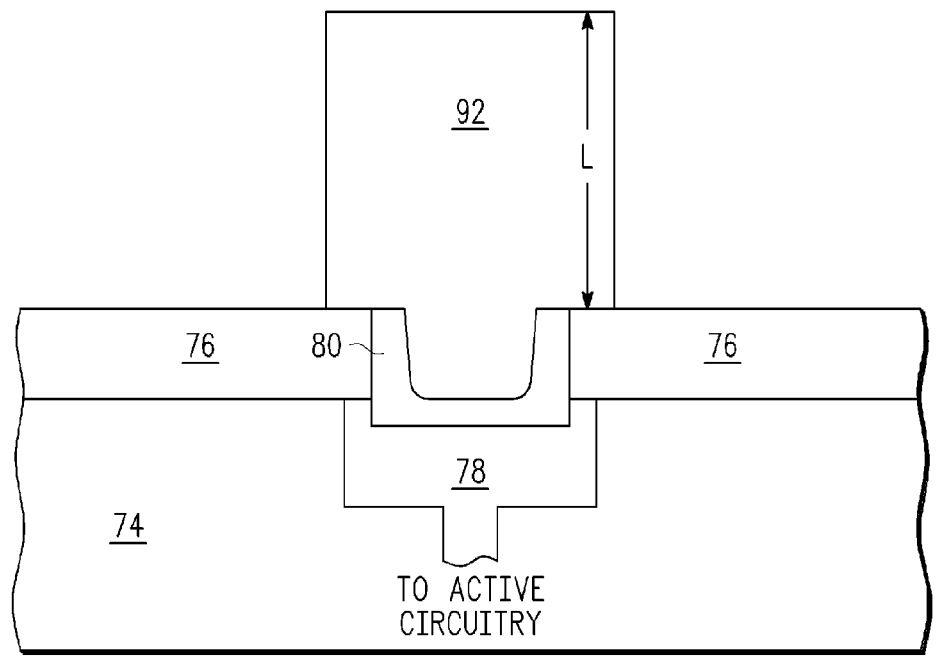

Illustrated in FIG. 20 is a cross-section of further processing of semiconductor device 74. The semiconductor device 74 is removed from the tin immersion bath 90 of FIG. 19 after a pure tin micropad 92 has been formed from the combination of the seed layer 82 and the copper stud 88. The pure tin micropad 92 has a height of "L" which is sufficient to be bonded to another micropad (not shown) that is copper, for example, and be consumed completely to form a intermetallic bond. Therefore, the value of "L" may vary depending upon the height of the other micropad that is being bonded to. It should be noted that the removal of copper and the replacement with tin which occurs from the tin immersion bath 90 of FIG. 19 functions to remove the seed layer 82 which is replaced by pure tin. The pure tin has a purity of at least-five percent and preferably the purity is approximately ninety-nine percent or greater. The barrier layer 80 continues to be recessed in the substrate of the semiconductor device 74.

By now it should be appreciated that there has been provided a micropad and method of formation that has improved shelf-life because the micropad is pure or substantially pure tin in composition. As a result oaf the pure tin content, the micropad is not susceptible of forming intermetallic bonds with another metal at room temperatures. Such a formation of intermetallic bonds would require an increase in the height of the micropad thereby making the micropad more rigid. Both of these characteristics are distinct disadvantages for stacking two integrated circuits or two semiconductor wafers. Differing steps may be used to form the pure tin micropad. In one form an electroless immersion plating process is used. In another from an electroplating bath process is used. In either from since no copper is present prior to bonding, the opportunity for copper and tin intermetallic compounds to form within the micropad is substantially removed during storage of the semiconductor device as well as during a temperature ramp-up. As a result, the total required height of the tin micropad may be minimized as there will be adequate tin present when a thermo compression bond is made with another micropad of another semiconductor. Additionally, the semiconductor may be stored for a significant amount of time prior to Thermocompression bonding the with another semiconductor device to form a 3D stacked package. The increased shelf life of the product prior to bonding permits both a manufacturer and an end user with additionally flexibility as to when products are packaged into multiple chip packages and permits additional customization options.

The semiconductor substrate of the semiconductor devices described herein can by any semiconductor material or combinations of materials, such as gallium arsenide, silicon germanium, silicon-on-insulator (SOI), silicon, monocrystalline silicon, the like, and combination of the above. Moreover, the terms "front," "back," "top," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations that those illustrated or otherwise described herein.

Although the invention is described herein with reference to specific embodiments, various modification and changes can be made without departing from the scope of the present invention as set forth in the claims below. For example, while the dimensions of the pure tin micropad are reduced by using the embodiments described herein, these dimensions can be any of various heights, lengths and widths. The contact of the semiconductor device to which the pure tin micropad connects may be implemented in any of various structural forms, including circular shapes. The contact may represent electrical power supply connections, a portion of a multiple bit signal bus or other signal conductors. While the illustrated embodiments described the formation of copper studs which are used to create the pure tin micropads, studs formed with other metals may be used in lieu of the copper studs.

In one form there is herein provided a method wherein a first semiconductor device having an external contact is provided. A stud of copper is formed over the external contact, wherein the stud extends above a surface of the first semiconductor device. The stud of copper is immersed in a solution of tin in which the tin replaces at least 95 percent of the copper of the stud resulting in a tin micropad that has less than 5 percent copper by weight. In one form a passivation layer is formed over a top surface of the semiconductor device having a opening over the external contact. In another form the solution contains a tin salt, and a temperature of the solution is within a range from 60 degrees Celsius to 85 degrees Celsius. In another form a barrier layer is formed over the external contact prior to the step of forming a stud. In yet another form a passivation layer is formed over a top surface of the semiconductor device having an opening over the external contact. In this form the barrier layer is formed by depositing a metal layer over the passivation layer and the external contact prior to forming the stud. Chemical mechanical polishing on the metal layer is performed such that the metal layer is removed over the passivation layer and is retained in the opening. In another form forming the barrier layer is implemented by recessing the external contact prior to depositing the metal layer. In this embodiment forming the barrier layer is implemented by forming a tantalum barrier layer. In another form the barrier layer is formed by electroless plating on the external contact. In yet another form the barrier layer is formed by electroless plating by immersing the external contact in a bath comprising cobalt. In yet another form a passivation layer is formed over a top surface of the semiconductor device having an opening over the external contact. In this form the barrier layer is formed by forming a metal layer over the passivation layer and the external contact prior to forming the stud. The metal layer is etched using the stud as a mask to leave a portion of the metal layer covered by the stud as the barrier layer. In yet another form forming the stud is further implemented by forming a copper seed layer after forming the metal layer and prior to etching the metal layer. In yet another form a second semiconductor device having a copper micropad is bonded to the semiconductor device by pressing the copper micropad against the tin micropad in an ambient temperature in excess of the melting point of tin. In another form the stud is formed by forming a photoresist layer over the first semiconductor device having an opening over the external contact and performing an electroplating step using the photoresist layer as a mask.

In yet another for there is provided a method in which a first semiconductor device is provided having a copper stud extending from an external contact above a surface of the first semiconductor device. The copper stud is converted to a tin micropad that is less than 5 percent copper by weight by immersing the copper stud in a bath of tin salt solution that is within a range of a temperature from 60 degrees Celsius to 85 degrees Celsius. In yet another form providing the first semiconductor device is further implemented by forming the copper stud by forming a photoresist layer over the first semiconductor device having an opening over the external contact. An electroplating step is then performed using the photoresist layer as a mask. In yet another form a second semiconductor device having a copper micropad is provided. The copper micropad is pressed against the tin micropad in an ambient temperature in excess of the melting point of tin. In another from the copper stud of the first semiconductor device has a seed layer adjacent to the external contact. In yet another form the first semiconductor device has a barrier layer between the seed layer and the external contact. In another form there is provided a barrier layer between and in direct contact with the external contact and the copper stud.

In another form there is provided a method of providing a semiconductor device having a surface and a contact that is partially exposed. A portion of the contact that is exposed is recessed lower than the surface. A copper stud extending from an external contact above a surface of the semiconductor device is formed. The copper stud is converted to a tin micropad that is at lest ninety-nine percent tin by weight by immersing the copper stud in a bath of tin containing solution that is at a temperature within a range of 60 degrees Celsius to 85 degrees Celsius. In another form a tantalum barrier layer is formed between the contact and the copper stud to prevent penetration of copper and tin into the contact from above.

Accordingly, the specification and figures are to regarded in an illustrative rather than a restrictive sense, and all such modification are intended to be included within the scope of the present invention. Any benefits, advantages, or solutions to problems that are described herein with regard to specific embodiments are not intended to be construed as a critical, required, or essential feature or element of any or all the claims.

The term "coupled, " as used herein, is not intended to be limited to a direct coupling or a mechanical coupling.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits an particular claim containing such introduced claim element to inventions containing only one such element, even when the same claim include the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

What is claimed is:

1. A method comprising:
   providing a first semiconductor device having an external contact;

forming a stud of copper over the external contact, wherein the stud extends above a surface of the first semiconductor device; and immersing the stud of copper in a solution of tin in which the tin replaces at least 95 percent of the copper of the stud resulting in a tin micropad that has less than 5 percent copper by weight.

2. The method of claim 1, further comprising forming a passivation layer over a top surface of the first semiconductor device having an opening over the external contact.

3. The method of claim 1, wherein the step of immersing is further characterized by the solution comprising a tin salt solution and a temperature of the solution being within a range of 60 degrees Celsius to 85 degrees Celsius.

4. The method of claim 1, further comprising:
forming a barrier layer over the external contact prior to the step of forming a stud.

5. The method of claim 4, further comprising:
forming a passivation layer over a top surface of the first semiconductor device having an opening over the external contact;
wherein the step of forming the barrier layer comprises:
depositing a metal layer over the passivation layer and the external contact prior to forming the stud; and
performing chemical mechanical polishing on the metal layer such that the metal layer is removed over the passivation layer and is retained in the opening.

6. The method of claim 5, wherein the step of forming the barrier layer further comprises:
recessing the external contact prior to the step of depositing the metal layer, and
wherein forming the barrier layer is further characterized by the barrier layer comprising tantalum.

7. The method of claim 4, wherein forming the barrier layer comprises electroless plating on the external contact.

8. The method of claim 7, wherein forming the barrier layer is further characterized by electroless plating comprising immersing the external contact in a bath comprising cobalt.

9. The method of claim 4, further comprising:
forming a passivation layer over a top surface of the first semiconductor device having an opening over the external contact;
wherein the step of forming the barrier layer comprises:
forming a metal layer over the passivation layer and the external contact prior to the step of forming the stud; and
etching the metal layer using the stud as a mask to leave a portion of the metal layer covered by the stud as the barrier layer.

10. The method of claim 9, wherein the step of forming the stud is further characterized by forming a copper seed layer after the step of forming the metal layer and prior to the step of etching the metal layer.

11. The method of claim 1, further comprising:
providing a second semiconductor device having a copper micropad; and
pressing the copper micropad against the tin micropad in an ambient temperature in excess of a melting point of tin.

12. The method of claim 11, wherein forming the stud is further characterized by:
forming a photoresist layer over the first semiconductor device having an opening over the external contact; and
performing an electroplating step using the photoresist layer as a mask.

13. A method, comprising:
providing a first semiconductor device having a copper stud extending from an external contact above a surface of the first semiconductor device; and
converting the copper stud to a tin micropad that is less than 5 percent copper by weight by immersing the copper stud in a bath of tin salt solution that is within a range of a temperature from 60 degrees Celsius to 85 degrees Celsius.

14. The method of claim 13, wherein the step of providing the first semiconductor device is further characterized by forming the copper stud by:
forming a photoresist layer over the first semiconductor device having an opening over the external contact; and
performing an electroplating step using the photoresist layer as a mask.

15. The method of claim 13, further comprising:
providing a second semiconductor device having a copper micropad; and
pressing the copper micropad against the tin micropad in an ambient temperature in excess of a melting point of tin.

16. The method of claim 13, wherein the step of providing the first semiconductor device is further characterized by the copper stud of the first semiconductor device having a seed layer adjacent to the external contact.

17. The method of claim 16, wherein the step of providing the first semiconductor device is further characterized by the first semiconductor device having a barrier layer between the seed layer and the external contact.

18. The method of claim 16, wherein the step of providing the first semiconductor device is further characterized by a barrier layer between and in direct contact with the external contact and the copper stud.

19. A method comprising:
providing a semiconductor device having a surface and a contact that is partially exposed, wherein a portion of the contact that is exposed is recessed lower than the surface;
forming a copper stud extending from an external contact above a surface of the semiconductor device; and
converting the copper stud to a tin micropad that is at least ninety-nine percent tin by weight by immersing the copper stud in a bath of tin-containing solution that is at a temperature within a range of 60 degrees Celsius to 85 degrees Celsius.

20. The method of claim 19 further comprising:
forming a tantalum barrier layer between the contact and the copper stud to prevent penetration of copper and tin into the contact from above.

* * * * *